US009348708B2

(12) United States Patent
Jung et al.

(10) Patent No.: US 9,348,708 B2
(45) Date of Patent: May 24, 2016

(54) MEMORY SYSTEM PERFORMING ADDRESS MAPPING ACCORDING TO BAD PAGE MAP

(71) Applicant: SAMSUNG ELECTRONICS CO., LTD., Suwon-Si, Gyeonggi-Do (KR)

(72) Inventors: Dawoon Jung, Hwaseong-Si (KR); Jungho Yun, Seoul (KR); Min-Chul Kim, Suwon-Si (KR); Youngil Seo, Yongin-Si (KR); Wonchul Lee, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 143 days.

(21) Appl. No.: 14/172,948

(22) Filed: Feb. 5, 2014

(65) Prior Publication Data

US 2014/0237286 A1 Aug. 21, 2014

(30) Foreign Application Priority Data

Feb. 20, 2013 (KR) ........................ 10-2013-0018066

(51) Int. Cl.

*G06F 11/00* (2006.01)
*G06F 11/16* (2006.01)
*G06F 12/02* (2006.01)
*G11C 29/00* (2006.01)
*G06F 11/07* (2006.01)

(52) U.S. Cl.

CPC .......... *G06F 11/1666* (2013.01); *G06F 11/073* (2013.01); *G06F 11/0751* (2013.01); *G06F 12/0246* (2013.01); *G11C 29/76* (2013.01); *G06F 2212/7202* (2013.01)

(58) Field of Classification Search

CPC .... G11C 29/70; G11C 29/76; G06F 11/1666; G06F 11/0751; G06F 12/0246
See application file for complete search history.

(56) References Cited

U.S. PATENT DOCUMENTS

| | | | | |
|---|---|---|---|---|
| 6,158,024 | A | 12/2000 | Mandal | |
| 6,381,176 | B1 * | 4/2002 | Kim | G06F 12/0246 365/185.11 |
| 7,366,825 | B2 * | 4/2008 | Williams | G11C 16/10 711/103 |
| 7,996,736 | B2 | 8/2011 | Bottelli et al. | |
| 8,832,507 | B2 * | 9/2014 | Post | G06F 11/1048 714/718 |
| 9,069,657 | B2 * | 6/2015 | Post | G06F 12/0246 |
| 9,164,887 | B2 * | 10/2015 | Chiueh | G06F 11/1417 |
| 9,229,852 | B2 * | 1/2016 | Kandiraju | G06F 12/0246 |
| 9,235,502 | B2 * | 1/2016 | Khmelnitsky | G06F 12/0246 |
| 2004/0257888 | A1 | 12/2004 | Noguchi et al. | |
| 2006/0013048 | A1 | 1/2006 | Kim | |

(Continued)

FOREIGN PATENT DOCUMENTS

| | | | |
|---|---|---|---|
| JP | H08-063399 | A | 3/1996 |
| JP | H08-235070 | A | 9/1996 |
| JP | H11-327953 | A | 11/1999 |
| JP | 2006-031696 | A | 2/2006 |

(Continued)

*Primary Examiner* — Michael Maskulinski
(74) *Attorney, Agent, or Firm* — Volentine & Whitt, PLLC

(57) ABSTRACT

A memory system comprises a nonvolatile memory comprising a memory block having multiple pages, and a controller configured to control the nonvolatile memory to store data in the memory block according to a command and logical address received from an external source. The controller is configured to determine whether the logical address is currently mapped to a bad page of the memory block by referring to a bad page map, and as a consequence of determining that the logical address corresponds to the bad page, remaps the logical address to a different page and stores dummy data in the bad page.

12 Claims, 11 Drawing Sheets

(56) References Cited

U.S. PATENT DOCUMENTS

| | | | |
|---|---|---|---|
| 2008/0172530 | A1 | 7/2008 | Kim et al. |
| 2009/0125671 | A1* | 5/2009 | Flynn ........................ G06F 9/52 711/103 |
| 2009/0259806 | A1* | 10/2009 | Kilzer ................. G06F 12/0246 711/103 |
| 2010/0205363 | A1 | 8/2010 | Hwang et al. |
| 2012/0008390 | A1 | 1/2012 | Seong |

FOREIGN PATENT DOCUMENTS

| | | | |
|---|---|---|---|
| JP | 2010-186477 | A | 8/2010 |
| KR | 10-0630996 | B1 | 11/2004 |
| KR | 10-0575657 | B1 | 5/2006 |
| KR | 10-0692982 | B1 | 3/2007 |
| KR | 10-2008-0067144 | A | 7/2008 |
| KR | 10-2010-0091544 | A | 8/2010 |
| KR | 10-2012-0005838 | A | 1/2012 |

* cited by examiner

Fig. 4

| Cycle | 10 | $10^2$ | $5x10^2$ | $10^3$ | $5x10^3$ | $10^4$ |
|---|---|---|---|---|---|---|
| Page | 0 | 0 | 0 | 0 | 1 | 1 |
| | 0 | 0 | 0 | 0 | 0 | 1 |
| | 0 | 1 | 1 | 1 | 1 | 1 |
| | 0 | 0 | 0 | 0 | 0 | 0 |
| | 1 | 1 | 1 | 1 | 1 | 1 |
| | 0 | 0 | 0 | 1 | 1 | 1 |
| | 0 | 0 | 1 | 1 | 1 | 1 |
| | 0 | 0 | 1 | 1 | 1 | 1 |

MEMORY SYSTEM PERFORMING ADDRESS MAPPING ACCORDING TO BAD PAGE MAP

CROSS-REFERENCE TO RELATED APPLICATIONS

This application claims priority under 35 U.S.C. §119 to Korean Patent Application No. 10-2013-0018066 filed on Feb. 20, 2013, the subject matter of which is hereby incorporated by reference.

BACKGROUND OF THE INVENTION

The inventive concept relates generally to electronic memory technologies. More particularly, certain embodiments of the inventive concept relate to memory systems that perform address mapping for a nonvolatile memory device using a bad page map.

Memory devices may be roughly divided into two categories according to whether they retain stored data when disconnected from power. These categories include volatile memory devices, which lose stored data when disconnected from power, and nonvolatile memory devices, which retain stored data when disconnected from power.

Examples of volatile memory devices include static random access memory (SRAM) devices, dynamic random access memory (DRAM) devices, and synchronous DRAM (SDRAM) devices. Examples of nonvolatile memory devices include flash memory devices, read only memory (ROM) devices, programmable ROM (PROM) devices, electrically erasable and programmable ROM (EEPROM) devices, and various forms of resistive memory such as phase-change RAM (PRAM), ferroelectric RAM (FRAM), and resistive RAM (RRAM).

Most nonvolatile memory devices tend to wear out at a rate determined by usage. For instance, flash memory devices tend to wear out at a rate determined by the number of erase or program operations that have been performed. Where certain memory cells are used more often than others, they may wear out sooner, resulting in localized regions of defective or unreliable cells, such as “bad blocks”, “bad pages”, “bad sectors”, and so on.

To preserve reliability in the face of local deterioration, memory systems that incorporate flash memory devices and other types of nonvolatile memory devices typically include mechanisms for managing memory cells that have worn out. One technique is to remap addresses of defective regions to non-defective regions. Such remapping, however, may unduly increase the overhead of memory management, and it may also prevent some pages of memory from being used because they belong to a block that has been deemed worn out.

SUMMARY OF THE INVENTION

In one embodiment of the inventive concept, a memory system comprises a nonvolatile memory comprising a memory block having multiple pages, and a controller configured to control the nonvolatile memory to store data in the memory block according to a command and logical address received from an external source. The controller is configured to determine whether the logical address is currently mapped to a bad page of the memory block by referring to a bad page map, and as a consequence of determining that the logical address corresponds to the bad page, remaps the logical address to a different page and stores dummy data in the bad page.

In another embodiment of the inventive concept, a memory system comprises a nonvolatile memory comprising a memory block having multiple pages, and a controller configured to control the nonvolatile memory to store data in the memory block according to a command and logical address received from an external source. The controller is configured to determine whether the logical address is currently mapped to a bad page of the memory block by referring to a bad page map, and as a consequence of determining that the logical address corresponds to the bad page, remaps the logical address to a different page and stores dummy data in the bad page. The controller is further configured to determine whether a number of times that an erase operation has been performed on the memory block has reached a predetermined reference value, and as a consequence of determining that the number of times that an erase operation has been performed on the memory block has reached the predetermined reference value, update the bad page map based on a bad page list comprising information indicating whether each of multiple different pages is a bad page according to different numbers of erase values.

In another embodiment of the inventive concept, a method is provided for operating a memory system comprising a nonvolatile memory. The method comprises controlling the nonvolatile memory to store data in the memory block according to a command and logical address received from an external source, determining whether the logical address is currently mapped to a bad page of the memory block by referring to a bad page map, and, as a consequence of determining that the logical address corresponds to the bad page, remapping the logical address to a different page and stores dummy data in the bad page.

These and other embodiments of the inventive concept can potentially increase the lifetime and performance of memory cells by managing remapping operations on a page-by-page basis.

BRIEF DESCRIPTION OF THE DRAWINGS

The drawings illustrate selected embodiments of the inventive concept. In the drawings, like reference numbers indicate like features.

FIG. 4 is a table illustrating an example of a bad page list.

DETAILED DESCRIPTION

Embodiments of the inventive concept are described below with reference to the accompanying drawings. These embodiments are presented as teaching examples and should not be construed to limit the scope of the inventive concept.

Figure 1:
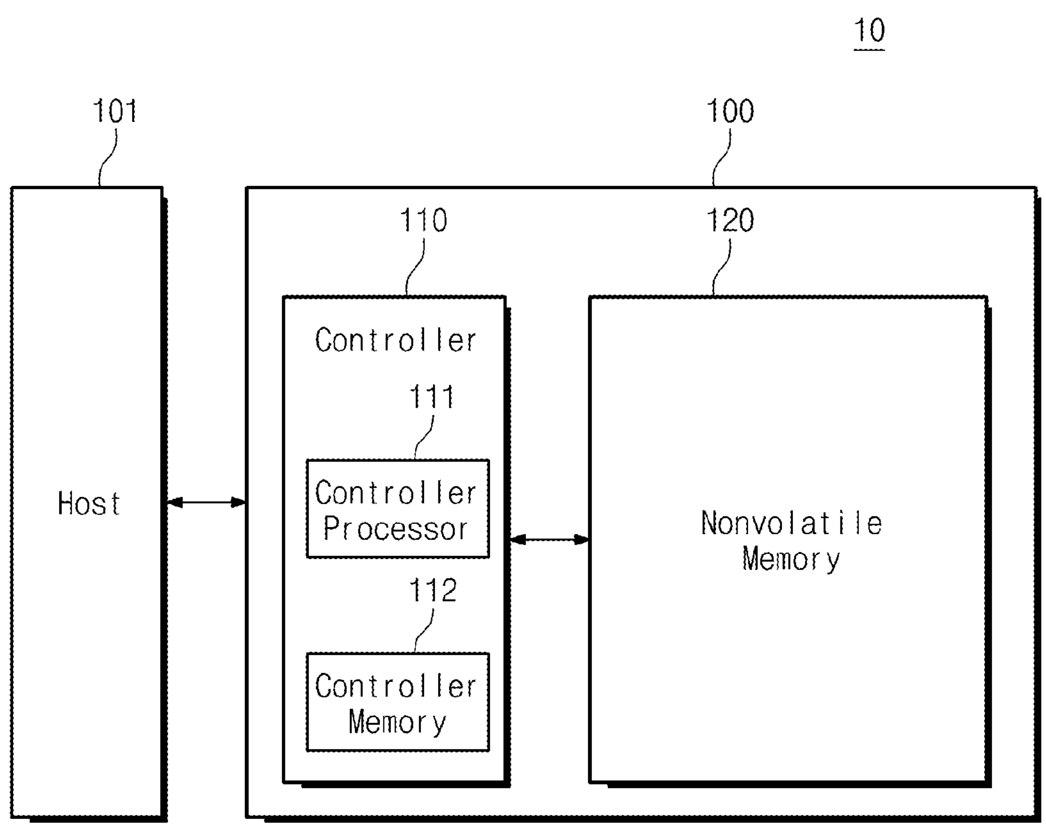
FIG. 1 is a block diagram illustrating a memory system in accordance with an embodiment of the inventive concept.

FIG. 1 is a block diagram illustrating a memory system 10 in accordance with an embodiment of the inventive concept.

Referring to FIG. 1, memory system 10 comprises a nonvolatile memory device 100 and a host 101. Nonvolatile memory device 100 comprises a controller 110 and a nonvolatile memory 120. Controller 110 comprises a controller processor 111 and a controller memory.

During typical operation, nonvolatile memory device 100 classifies a page in which data is damaged or at risk or damage as a bad page. Then, in an address mapping operation, nonvolatile memory device 100 does not map a logical address to a physical address of the page classified as a bad page.

Because nonvolatile memory device 100 prevents data from being stored in bad pages, it can have improved lifetime and improved accuracy. In a write operation, nonvolatile memory device 100 programs dummy data in a page classified as a bad page to improve a write speed.

Host 101 is configured to access nonvolatile memory device 100. Host 101 relies on nonvolatile memory device 100 to store data that is generated or used by various functions it performs. In other words, nonvolatile memory device 100 stores data processed by host 101.

Controller 110 provides an interface between nonvolatile memory 120 and host 101. Controller 110 drives firmware to control nonvolatile memory 120. Controller 110 controls read, write, and erase operations of nonvolatile memory 120 using the firmware in response to a request of host 101.

Controller processor 111 controls operations of controller 110. In certain implementations, controller processor 111 drives firmware for controlling nonvolatile memory 120.

Controller memory 112 can operate as a working memory of controller 110, a buffer memory between host 101 and nonvolatile memory 120 and a cache memory of nonvolatile memory 120.

Nonvolatile memory 120 stores data under control of controller 110. The type of nonvolatile memory 120 may be, for instance, ROM, programmable ROM (PROM), electrically programmable ROM (EPROM), electrically erasable programmable ROM (EEPROM), flash memory, PRAM, MRAM, RRAM, or FRAM, for example, although it is not limited to these types of memory.

In a write operation, host 101 provides write-requested data and a logical address of the data to nonvolatile memory device 100. Nonvolatile memory device 100 stores the data in nonvolatile memory 120 in response to a request of host 101.

A flash translation layer (FTL) is stored in controller memory 112 of controller 110. A bad page map representing a bad page is also stored in controller memory 112. The FTL and the bad page map may be loaded from a nonvolatile memory into controller 110 into controller memory 112, or from nonvolatile memory 120 into controller memory 112.

Where controller 110 receives a write request, controller 110 maps a logical address LA provided from host 101 to a physical address PA of nonvolatile memory 120 using the FTL. In a mapping operation, controller 110 precludes a logical address from being mapped to a physical address of a bad page by referring to the bad page map.

In a write operation, controller 110 controls nonvolatile memory 120 so that dummy data is written in a bad page. Where multiple pages are programmed at a time, controller 110 controls nonvolatile memory 120 so that a bad page and a normal page are programmed together with each other by programming dummy data in a bad page.

Controller 110 updates a bad page map in response to a program/erase cycle or elapsed time. Controller 110 updates a bad page map to continuously classify as bad pages those where data is damaged or at risk of damage.

Nonvolatile memory device 100 can classify a page in which data is damaged or at risk of damage as a bad page to prevent a logical address from being mapped to the classified bad page. The management of damaged memory cells on a page-by-page basis can potentially improve the lifetime of nonvolatile memory device 100 compared with management on a block-by-block basis.

Although nonvolatile memory device 100 is described as selecting and managing a bad page, the relevant unit could alternatively be defined by a word line. For example, nonvolatile memory device 100 may classify a word line connected to a page in which data is damaged or at risk of damage as a bad word line and can prevent a logical address from being mapped to pages connected to the classified bad word line. In this case, nonvolatile memory device 100 can classify a bad page as a page sharing a word line with a bad page to exclude that a logical address is mapped.

Nonvolatile memory device 100 can use various algorithms to classify a page in which data is damaged or at risk of damage as a bad page. Nonvolatile memory device 100 can continuously update a bad page map.

Figure 2:
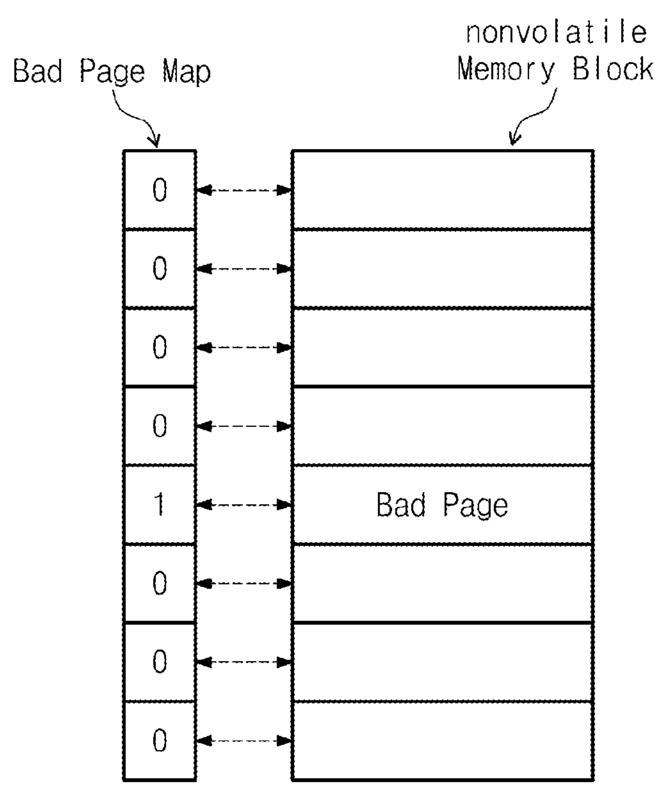
FIG. 2 is a diagram illustrating a bad page map in accordance with an embodiment of the inventive concept.

FIG. 2 is a diagram illustrating a bad page map in accordance with an embodiment of the inventive concept. In the embodiment of FIG. 2, the bad page map has a form of bitmap. However, this is as an illustration and the inventive concept is not limited to the bitmap. Alternatively, for instance, the bad page map may have a form of a list or tree structure.

Referring to FIG. 2, the bad page map comprises bits corresponding to each physical page of nonvolatile memory 120. In the bad page map, a bit corresponding to a page classified as a bad page may be set to be 1. A bit corresponding to a page classified as a normal page may be set to be 0. With reference to the bad page map, in the case that a page is represented by a bad page, controller 110 may not map a logical address to a physical address of the corresponding page.

Figure 3:
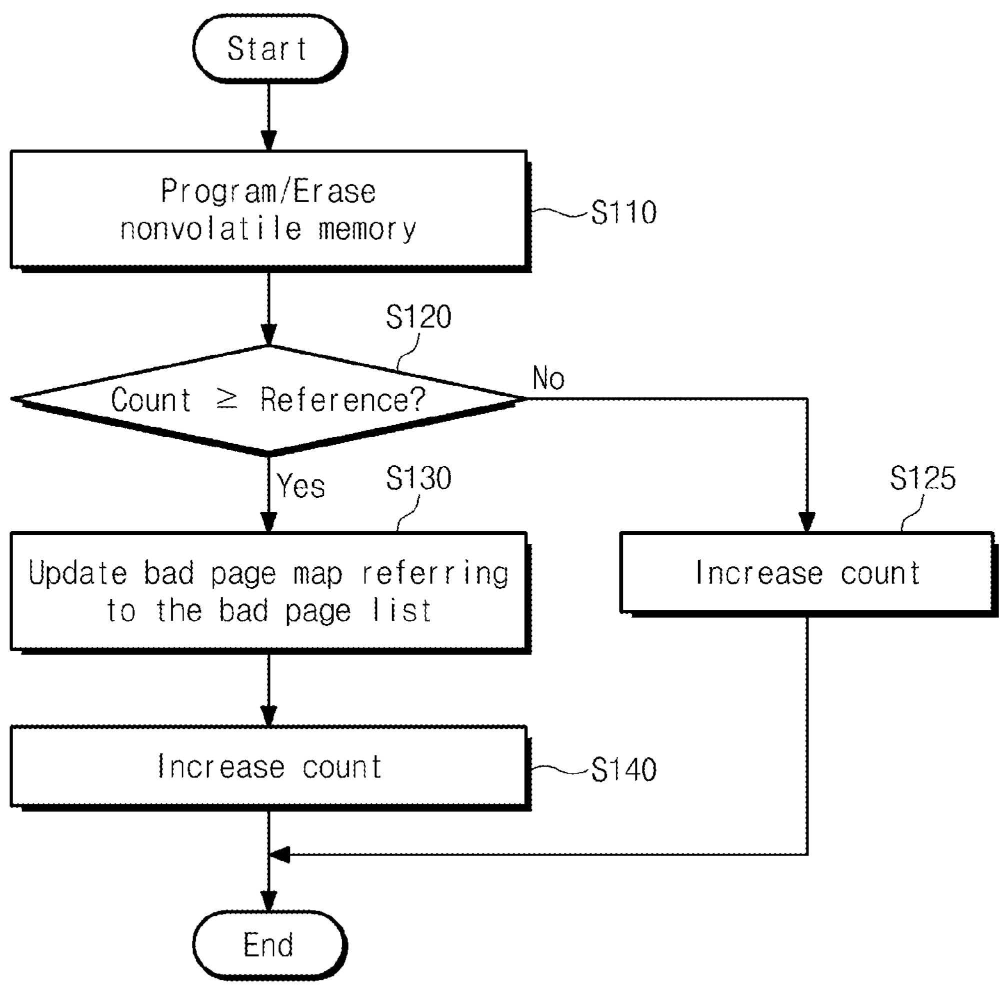
FIG. 3 is a flowchart illustrating a method of updating a bad page map in accordance with an embodiment of the inventive concept.

FIG. 3 is a flowchart illustrating a method of updating a bad page map in accordance with an embodiment of the inventive concept. In the method of FIG. 3, a bad page map is updated according to the number of program/erase cycles performed on a selected block as well as a bad page list. The bad page list indicates pages determined to be unreliable (i.e., damaged or at risk of being damaged) when reaching a certain number program/erase cycles.

As an example, FIG. 4 is a table illustrating a bad page list. In this example, the bad page list comprises bits representing whether each page is determined to be a bad page or not with respect to different numbers program/erase cycles. For example, a "1" under column labeled "10" indicates that a corresponding page is damaged or at risk of being damaged after 10 program/erase cycles.

In general, pages of nonvolatile memory 120 have different physical characteristics from each other. A physical characteristic of each of the pages of nonvolatile memory 120 can be evaluated in advance using experimental data with respect to a predetermined sample. Accordingly, the bad page list can be generated with reference to an evaluated physical characteristic of each page.

In a data processing operation, control processor 111 loads a bad page list in controller memory 112. Controller processor 111 performs a mapping operation with reference to the bad page list. The bad page list is loaded from nonvolatile memory 120 into controller memory 112. The bad page list may be loaded from a nonvolatile memory in controller 110 into controller memory 112.

Referring to FIG. 3, the method performs a program or erase operation on a selected page or memory block of nonvolatile memory 120 (S110). Then, the method determines, for the selected page or pages among the selected memory block, whether a corresponding program/erase count is greater than or equal to a corresponding reference value (S110). The corresponding reference value may be determined by consulting a bad page list. Typically, the corresponding reference value, for the selected page or a page among the selected block, is a lowest number of program/erase cycles in the bad page list for which that page is marked as being unreliable. For instance, using the example bad page list of FIG. 4, the reference value for a fifth page in the list is "10" because the page has a "1" under the column marked "10".

If the count is not greater than or equal to the reference value (S120=No), the count is increased (S125). After the count increases, the method is completed. Otherwise, if the count is greater than or equal to the reference value, the bad page map is updated with reference to the bad page list (S130). The bad page map classifies pages determined to be bad pages in the bad page list with respect to the current count with reference to the bad page list. Finally, the count is increased (S140), and method is completed.

As indicated by the above description, the method of FIG. 3 updates of the bad page map based on information stored in the bad page list, in combination with the number of program/erase cycles of each page.

Figure 5:
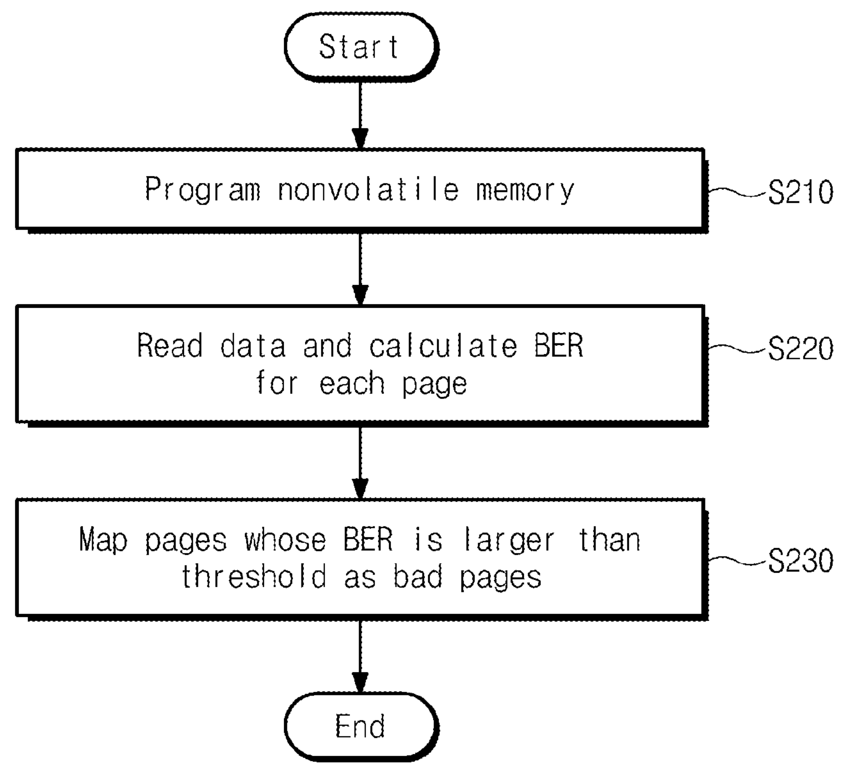
FIG. 5 is a flowchart illustrating a method of updating a bad page map in accordance with an embodiment of the inventive concept.

FIG. 5 is a flowchart illustrating a method of updating a bad page map in accordance with an embodiment of the inventive concept. In the method of FIG. 5, the bad page map is updated in response to a bit error rate (BER).

Referring to FIG. 5, a write operation is performed on nonvolatile memory 120 (S210). Thereafter, data stored in pages on which the write operation of step S210 is performed is read out (S220). A BER is calculated for the data read from each page.

Next, pages representing a bit error rate higher than a predetermined threshold value are classified as bad pages (S230). The bad page map is updated based on results of the classification. The predetermined threshold value is stored in nonvolatile memory device 100. The predetermined threshold value may be set in response to an external signal provided from host 101.

A threshold voltage of a memory cell in each page of nonvolatile memory 120 is changed with the lapse of time. A threshold voltage of a memory cell is changed by an interference phenomenon by adjacent memory cells. Examples of the interference phenomenon are a F-poly coupling and lateral charge spreading.

Besides interference by adjacent memory cells, a threshold voltage of a memory cell may be changed by read disturbance. A threshold voltage of a memory cell may be changed by a reduction of the quantity of charges of a memory cell over time.

A threshold voltage of a memory cell may be changed by various factors besides the factors described above. A threshold voltage may be changed by factors such as a process fail, distortion due to channel instability and program disturbance.

Because a threshold voltage of a memory cell is changed as time passes, data stored in each page of nonvolatile memory 120 may become unstable as time goes by. Reliability of data stored in each page of nonvolatile memory 120 may become highest immediately after a write operation is performed.

The method of FIG. 5 determines whether a page is a bad page or not on the basis of a bit error rate of data read from the page right after a write operation is performed. Because the method reads out data right after a write operation is performed, it can reduce an effect by read disturbance or factors changing a threshold voltage in the process of judging whether a page is a bad page.

Figure 6:
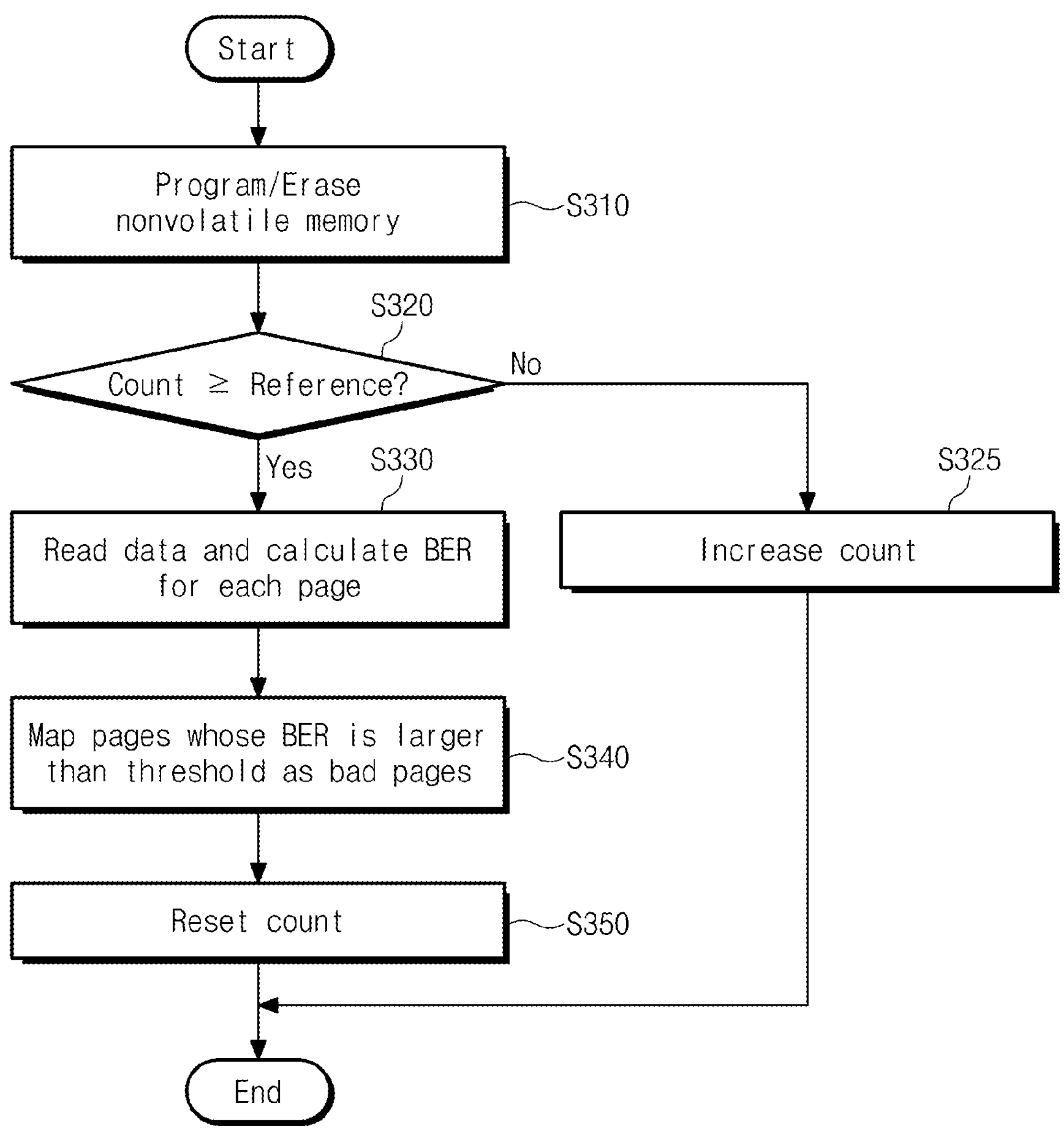
FIG. 6 is a flowchart illustrating a method of updating a bad page map in accordance with an embodiment of the inventive concept.

FIG. 6 is a flowchart illustrating a method of updating a bad page map in accordance with an embodiment of the inventive concept. In the method of FIG. 6, the bad page map is updated in response to a program/erase cycle and a BER.

Referring to FIG. 6, a program or erase operation is performed on nonvolatile memory 120 (S310). Thereafter, a count and a reference value are compared with each other (S320). The count represents the number of program/erase cycles that have been performed on a selected block. If the count does not reach the reference value (S320=No), the count increases and the method ends (S325). The reference value may be stored in nonvolatile memory device 100. The reference value may be set in response to an external signal provided from host 101. If the count is greater than the reference value (S320=Yes), data stored in pages of the selected block is read out (S330). A bit error rate is calculated for the read data.

Next, pages having a bit error rate higher than a predetermined threshold value are classified as bad pages (S340). On the basis of a classification result, a bad page map is updated. Thereafter, a value of the count is reset and the update operation is over (S350).

As indicated by the above description, the method of FIG. 6 determines whether a page is a bad page or not on the basis of a BER when the number of program/erase cycles reaches the predetermined reference value. In the method, a BER measured in response to a program/erase cycle with respect to the selected block may be considered.

Figure 7:
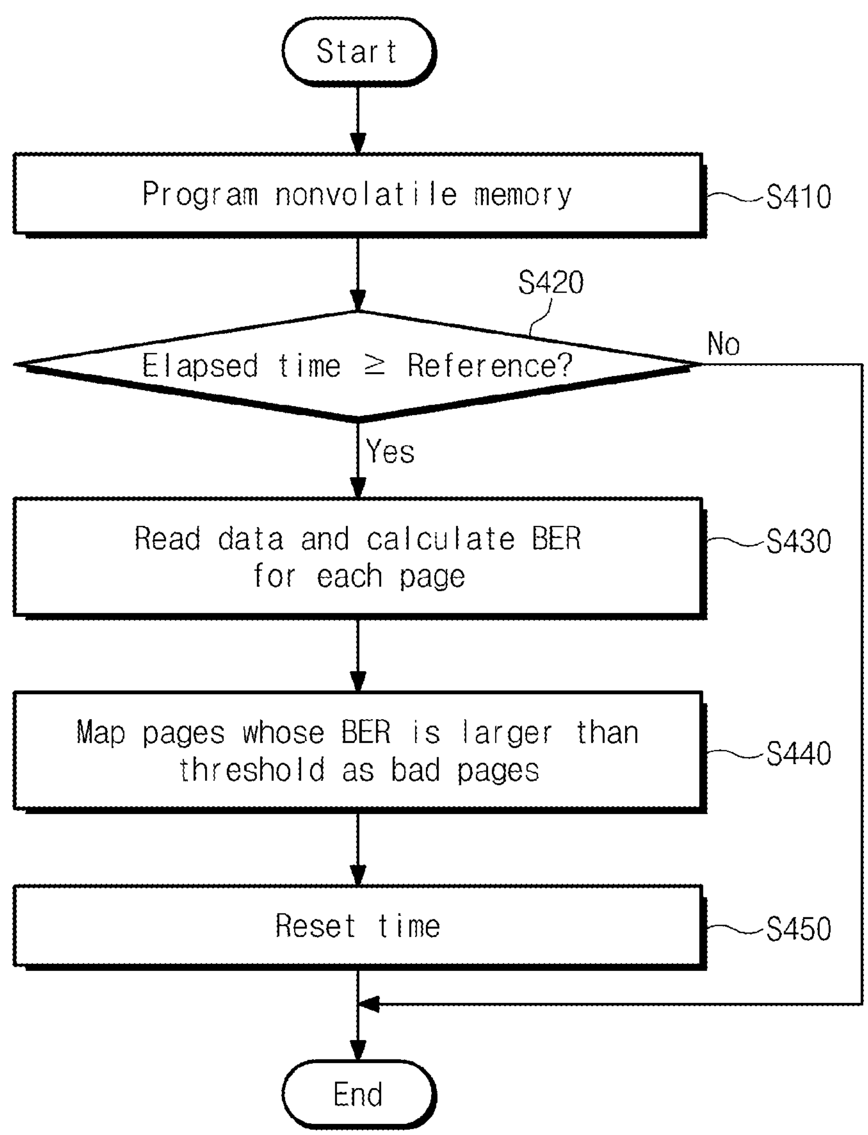
FIG. 7 is a flowchart illustrating a method of updating a bad page map in accordance with an embodiment of the inventive concept.

FIG. 7 is a flowchart illustrating a method of updating a bad page map in accordance with an embodiment of the inventive concept. In the method of FIG. 7, the bad page map is updated in response to time that elapsed after a write operation is performed and a BER.

Referring to FIG. 7, a program or erase operation is performed on nonvolatile memory 120 (S410). Next, an elapsed time and a reference value are compared with each other in a selected page (S420). The elapsed time is time that elapsed after a write operation is performed in the selected page or after the elapsed time is reset. If the elapsed time has not reached the reference value (S420=No), the method ends. The reference value is stored in nonvolatile memory device 100. The reference value may be set in response to an external signal being provided from host 101.

If the elapsed time is greater than the reference value (S420=Yes), data stored in pages of the selected block is read out (S430). A bit error rate is calculated for the read data.

Pages having a bit error rate higher than a predetermined threshold value are classified as bad pages (S440). On the basis of a classification result, a bad page map is updated. Thereafter, the elapsed time is reset and the method ends (S450).

As indicated by the above description, the method of FIG. 7 periodically determines whether a page is a bad page or not at every predetermined time interval. For example, the method can classify pages having a bit error rate higher than a predetermined threshold value when time of a certain percentage, for example, 80%, of data retention time elapsed as a bad page. According to the above method, a bit error rate measured in response to time that elapsed after a write operation is performed may be considered.

Figure 8:
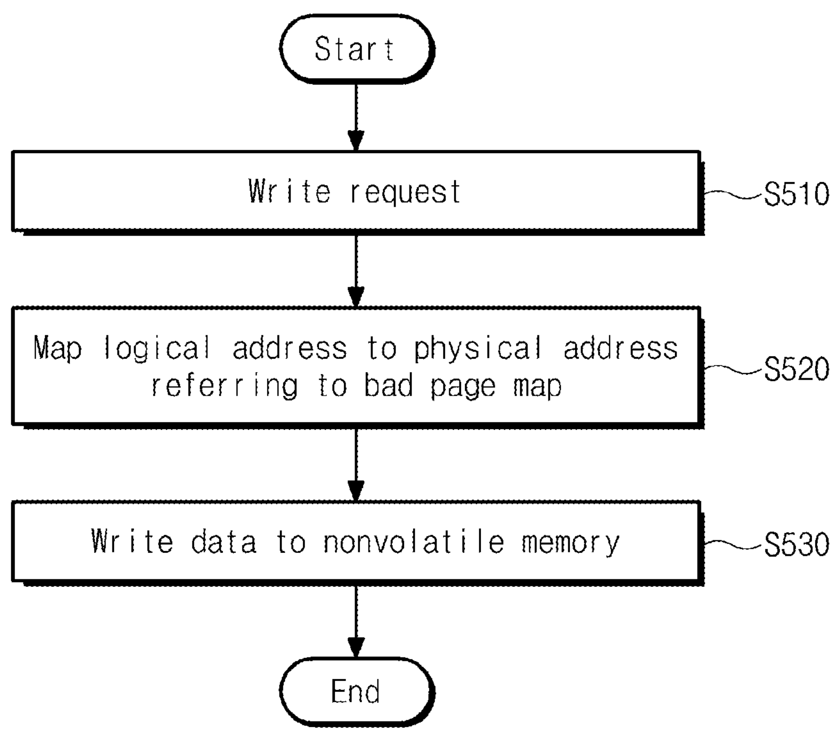
FIG. 8 is a flowchart illustrating a method of writing data of a nonvolatile memory device in accordance with an embodiment of the inventive concept.

FIG. 8 is a flowchart illustrating a method of writing data of a nonvolatile memory device in accordance with an embodiment of the inventive concept. In the method of FIG. 8, nonvolatile memory device 100 prevents a logical address from being mapped to a physical address of a page classified as a bad page with reference to a bad page map. Because nonvolatile memory device 100 does not use a page in which data is at risk of damage as a storage space, it may have improved lifetime and improved accuracy.

Referring to FIG. 8, a write request is provided from host 101 (S510). Host 101 may provide a write command, file data of write-requested data and a logical address to nonvolatile memory device 100.

Next, a logical address provided from host 101 is mapped to a physical address of nonvolatile memory 120 (S520). Nonvolatile memory device 100 maps a logical address to a physical address with reference to the bad page map. Nonvolatile memory device 100 prevents a logical address from being mapped to a physical address classified as a bad page with reference to the bad page map. Subsequently, the write-requested data is written in an area of nonvolatile memory 120 corresponding to the physical address to which the logical address is mapped (S530).

As indicated by the above description, in the method of FIG. 8, nonvolatile memory device 100 classifies a page in which data is damaged or at risk of damage as a bad page and stores a classification result in a bad page map. Nonvolatile memory device 100 prevents a page classified as a bad page from being used as a data storage space with reference to the bad page map in the mapping process. Because nonvolatile memory device 100 does not store data in the bad page, it may have improved lifetime and improved accuracy.

Figure 9:
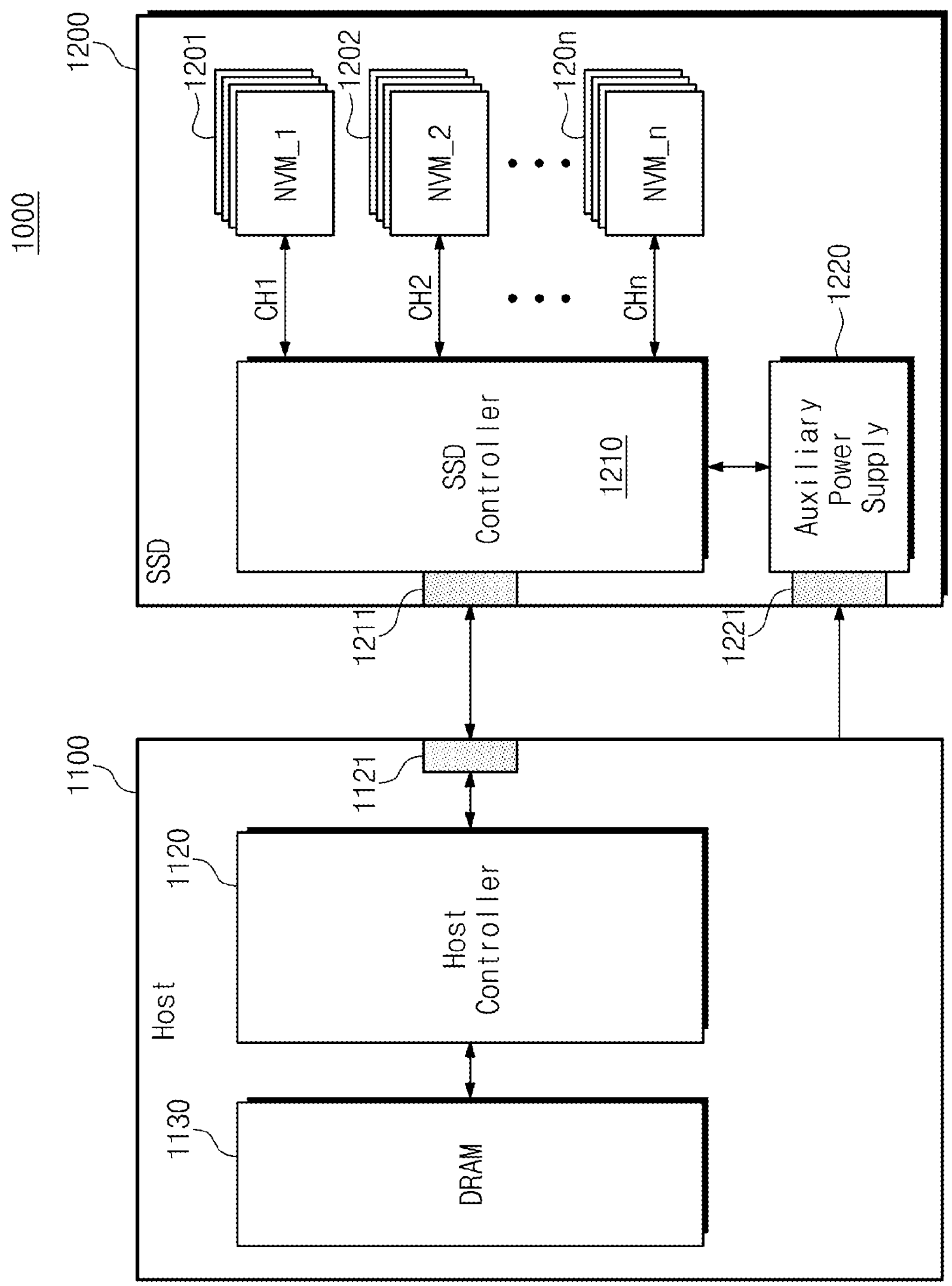
FIG. 9 is a block diagram illustrating a solid state drive (SSD) comprising a memory system in accordance with an embodiment of the inventive concept.

FIG. 9 is a block diagram illustrating an SSD 1000 comprising a memory system in accordance with an embodiment of the inventive concept.

Referring to FIG. 9, SSD 1000 comprises a host 1100 and a SSD 1200. Host 1100 comprises a host interface 1121, a host controller 1120 and a DRAM 1130.

Host 1100 stores data in SSD 1200 or reads data stored in SSD 1200. Host controller 1120 transmits a signal SGL such as a command, an address, a control signal and an ID representing category of file to SSD 1200 through SSD 1200. DRAM 1130 is a main memory of host 1100.

SSD 1200 exchanges signal SGL with host 1100 through host interface 1211 and receives power from a power supply through a power connector 1221. SSD 1200 comprises multiple nonvolatile memories 1201~**120*n*, a SSD controller 1210 and an auxiliary power supply 1220. Nonvolatile memories 1201~120*n*** may be embodied by a PRAM, a MRAM, an ReRAM, a FRAM, etc. besides a NAND type flash memory.

Nonvolatile memories 1201~**120*n* are used as a storage medium. Nonvolatile memories 1201~120*n* may be connected to SSD controller 1210 through multiple channels CH1~CHn, with one or more nonvolatile memories connected to one channel. Nonvolatile memories 1201~120*n*** may also be connected to the same data bus.

SSD controller 1210 exchanges signal SGL with host 1100 through host interface 1211. Signal SGL may comprise a command, an address, data, etc. SSD controller 1210 writes data in a corresponding nonvolatile memory or reads data from a corresponding nonvolatile memory according to a command of host 1100.

Auxiliary power supply 1220 is connected to host 1100 through power connector 1221. Auxiliary power supply 1220 can be provided with power from host 1100 to be charged. auxiliary power supply 1220 may be located inside SSD 1200 or outside SSD 1200. For example, auxiliary power supply 1220 may be located in a main board and may provide an auxiliary power to SSD 1200.

SSD 1200 classifies a page in which data is at risk of damage as a bad page and stores a classification result in a bad page map. SSD 1200 prevents a page classified as a bad page from being used as a data storage space with reference to the bad page map in the mapping process. Because SSD 1200 does not store data in the bad page, it may have improved lifetime and improved accuracy.

Figure 10:
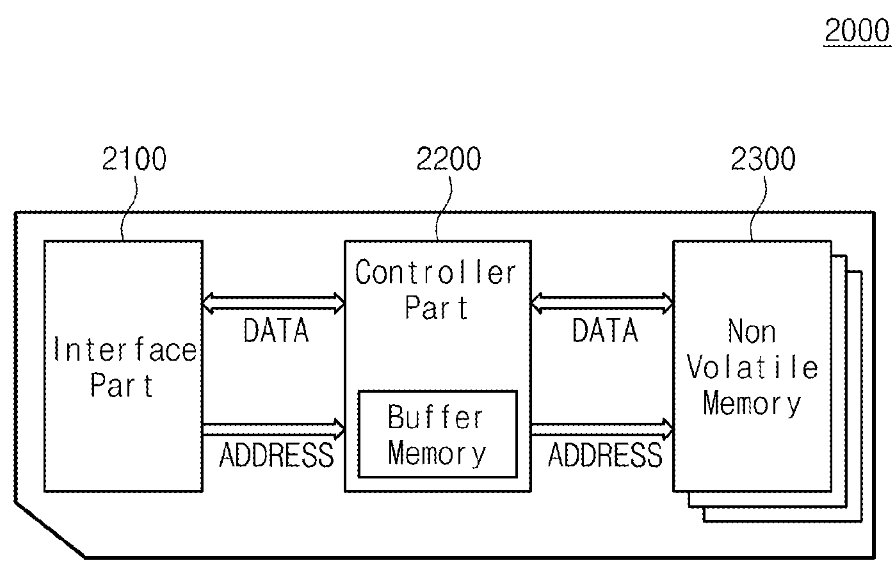
FIG. 10 is a block diagram illustrating a memory card comprising a nonvolatile memory device in accordance with an embodiment of the inventive concept.

FIG. 10 is a block diagram illustrating a memory card 2000 comprising a nonvolatile memory device in accordance with an embodiment of the inventive concept. Memory card 2000 may be, for example, a MMC card, a SD card, a multiuse card, a micro SD card, a memory stick, a compact SD card, an ID card, a PCMCIA card, a SSD card, a chip card, a smart card, a USB card, etc.

Referring to FIG. 10, memory card 2000 comprises an interface part 2100 performing an interface with the outside, a controller 2200 having a buffer memory and controlling an operation of memory card 2000 and at least one of nonvolatile memory devices 2300. Controller 2200 is a processor and can control write and read operations of nonvolatile memory device 2300. Controller 2200 couples to nonvolatile memory device 2300 and interface part 2100 through a data bus DATA and an address bus ADDRESS.

Memory card 2000 classifies a page in which data is at risk of damage as a bad page and stores a classification result in a bad page map. Memory card 2000 prevents the page classified as a bad page from being used as a data storage space with reference to the bad page map in a mapping process. Because memory card 2000 does not store data in the bad page, it may have improved lifetime and improved accuracy.

Figure 11:
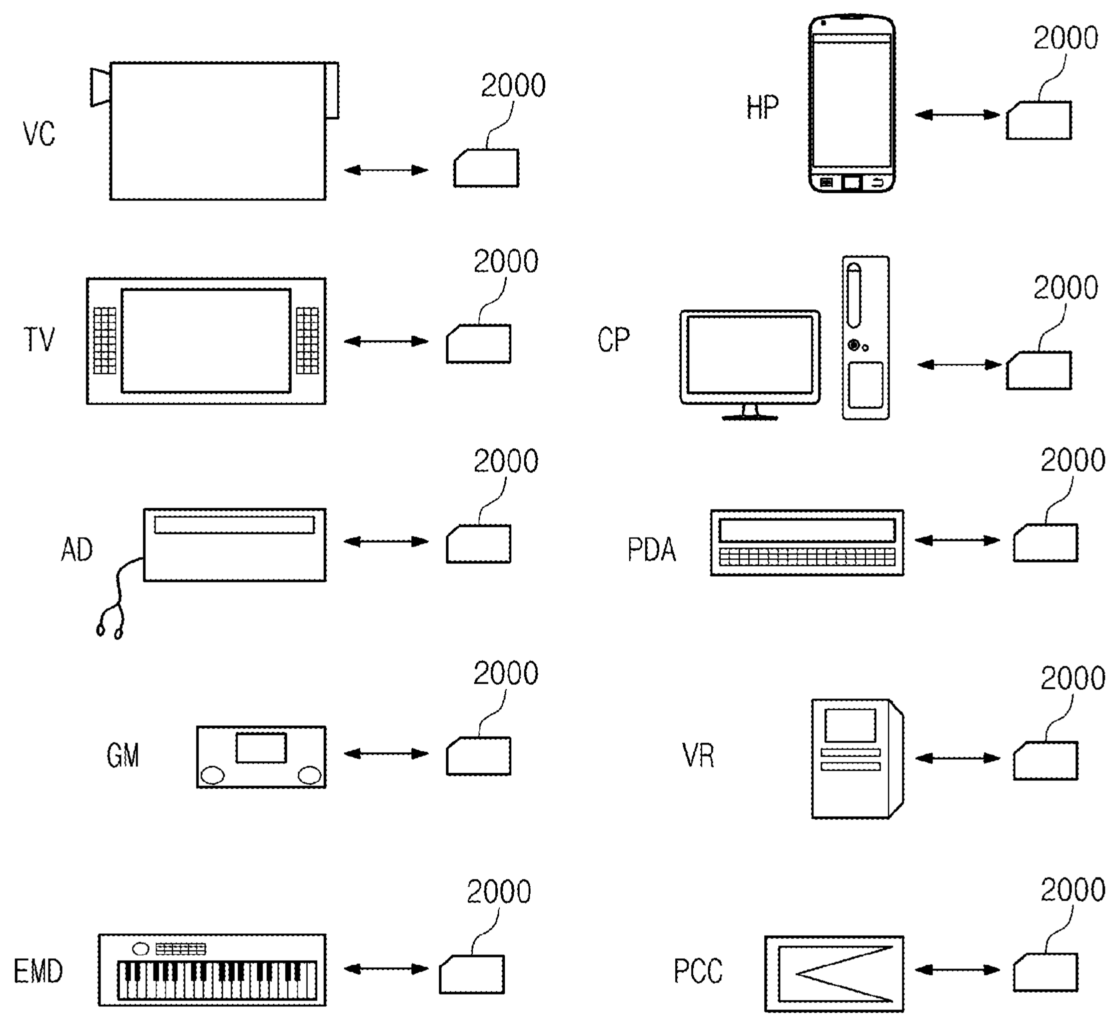
FIG. 11 is a drawing illustrating various systems comprising a memory card in accordance with embodiments of the inventive concept.

FIG. 11 is a drawing illustrating various systems using a memory card in accordance with embodiments of the inventive concept.

Referring to FIG. 11, memory card 2000 may be used in a video camera, a television, an audio device, a game device, an electronic music device, a cellular phone, a computer, a personal digital assistant (PDA), a voice recorder and a PC card.

A nonvolatile memory device in accordance with an embodiment of the inventive concept can be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Because the above described nonvolatile memory devices are managed by page unit, their lifetime and accuracy can be improved.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A memory system, comprising:

a nonvolatile memory comprising a memory block having multiple pages; and a controller configured to control the nonvolatile memory to program data in the memory block in response to a write request and logical address received from an external source;

wherein the controller is configured to determine whether the logical address is currently mapped to a bad page of the memory block by referring to a bad page map, and as a consequence of determining that the logical address corresponds to the bad page, remaps the logical address to a different page and stores dummy data in the bad page, and wherein, as a consequence of determining that the logical address corresponds to the bad page, the controller further programs dummy data in a page sharing a word line with the bad page.

2. The memory system of claim 1, wherein if a predetermined verification condition is satisfied, the controller reads data programmed in multiple pages, determines a bit error rate of the read data, and updates the bad page map based on the determined bit error rate.

3. The memory system of claim 2, wherein the predetermined verification condition is satisfied where the number of times that an erase operation has been performed on the memory block reaches a predetermined reference value.

4. The memory system of claim 2, wherein the predetermined verification condition is satisfied where a predetermined reference time passes after a write operation is performed on the memory block.

5. The memory system of claim 1, wherein if a predetermined verification condition is satisfied, the controller reads data programmed in multiple pages, determines a bit error rate of each of the multiple pages based on the read data, compares the determined bit error rates with a bit error threshold value, and updates the bad page map so that pages having a bit error rate greater than the bit error threshold value are classified as bad pages.

6. A memory system, comprising:

a nonvolatile memory comprising a memory block having multiple pages; and a controller configured to control the nonvolatile memory to program data in the memory block in response to a write request and logical address received from an external source;

wherein the controller is configured to determine whether the logical address is currently mapped to a bad page of the memory block by referring to a bad page map, and as a consequence of determining that the logical address corresponds to the bad page, remaps the logical address to a different page and stores dummy data in the bad page, and wherein the controller comprises:

a controller memory configured to store a flash translation layer and the bad page map; and a controller processor configured to execute the flash translation layer stored in the controller memory, wherein the flash translation layer maps the logical address to a physical address of the nonvolatile memory such that the data is written in pages not designated as bad pages according to the bad page map.

7. The memory system of claim 6, wherein the bad page map is stored in the form of bitmap.

8. The memory system of claim 7, wherein the bad page map comprises bits corresponding to pages, and wherein bits corresponding to bad pages are set to a first logical value and bits corresponding to non-bad pages are set to a second logical value.

9. A memory system, comprising:

a nonvolatile memory comprising a memory block having multiple pages; and a controller configured to control the nonvolatile memory to program data in the memory block in response to a write request and logical address received from an external source;

wherein the controller is configured to determine whether the logical address is currently mapped to a bad page of the memory block by referring to a bad page map, and as a consequence of determining that the logical address corresponds to the bad page, remaps the logical address to a different page and programs dummy data in the bad page;

wherein the controller is further configured to determine whether a number of times that an erase operation has been performed on the memory block has reached a predetermined reference value, and as a consequence of determining that the number of times that an erase operation has been performed on the memory block has reached the predetermined reference value, update the bad page map based on a bad page list comprising information indicating whether each of multiple different pages is a bad page according to different numbers of erase values, and wherein, as a consequence of determining that the logical address corresponds to the bad page, the controller further programs dummy data in a page sharing a word line with the bad page.

10. The memory system of claim 9, wherein the bad page map is stored in the form of bitmap and comprises bits corresponding to different pages, and wherein bits corresponding to bad pages are set to a first logical value and bits corresponding to non-bad pages are set to a second logical value.

11. A method of operating a memory system comprising a nonvolatile memory, comprising:

controlling the nonvolatile memory to program data in the memory block in response to a write request and logical address received from an external source;

determining whether the logical address is currently mapped to a bad page of the memory block by referring to a bad page map;

as a consequence of determining that the logical address corresponds to the bad page, remapping the logical address to a different page and programs dummy data in the bad page;

determining whether a number of times that an erase operation has been performed on the memory block has reached a predetermined reference value;

as a consequence of determining that the number of times that an erase operation has been performed on the memory block has reached the predetermined reference value, updating the bad page map based on a bad page list comprising information indicating whether each of multiple different pages is a bad page according to different numbers of erase values; and as a consequence of determining that the logical address corresponds to the bad page, further programming dummy data in a page sharing a word line with the bad page.

12. The method of claim 11, wherein the bad page map is stored in the form of bitmap and comprises bits corresponding to different pages, and wherein bits corresponding to bad pages are set to a first logical value and bits corresponding to non-bad pages are set to a second logical value.

* * * * *